(12) United States Patent
Clancy et al.

(10) Patent No.: US 8,009,441 B2
(45) Date of Patent: Aug. 30, 2011

(54) ELECTRONIC COMPONENT COVER AND ARRANGEMENT

(75) Inventors: Kevin Clancy, Calgary (CA); Ken Frayn, Canmore (CA); Robert Hertlein, San Diego, CA (US)

(73) Assignee: Novatel Wireless, Inc., San Diego, CA (US)

( * ) Notice: Subject to any disclaimer, the term of this patent is extended or adjusted under 35 U.S.C. 154(b) by 0 days.

(21) Appl. No.: 12/643,987

(22) Filed: Dec. 21, 2009

(65) Prior Publication Data

US 2010/0097774 A1    Apr. 22, 2010

Related U.S. Application Data

(63) Continuation of application No. 11/768,166, filed on Jun. 25, 2007, now Pat. No. 7,636,245.

(51) Int. Cl.
  *H05K 9/00* (2006.01)
(52) U.S. Cl. ................................ 361/816
(58) Field of Classification Search ............ 361/800, 361/816, 818; 174/377, 387; 257/659, 704
  See application file for complete search history.

(56) References Cited

U.S. PATENT DOCUMENTS

| | | | | |
|---|---|---|---|---|
| 4,648,125 A | * | 3/1987 | Brown | 455/575.1 |
| 4,894,663 A | * | 1/1990 | Urbish et al. | 343/702 |
| 5,220,489 A | * | 6/1993 | Barreto et al. | 361/783 |
| 5,270,488 A | * | 12/1993 | Ono et al. | 174/350 |
| 5,422,433 A | * | 6/1995 | Rivera et al. | 174/382 |
| 5,548,084 A | * | 8/1996 | Tracy | 174/381 |
| 5,607,791 A | * | 3/1997 | Garcia et al. | 429/96 |
| 5,819,163 A | * | 10/1998 | Tsukamoto et al. | 455/575.1 |
| 5,938,455 A | * | 8/1999 | Glovatsky et al. | 439/74 |
| 6,333,459 B1 | * | 12/2001 | Sato et al. | 174/377 |
| 6,452,811 B1 | * | 9/2002 | Tracy et al. | 361/816 |
| 6,897,373 B2 | * | 5/2005 | Barabash | 174/377 |
| 2002/0180032 A1 | * | 12/2002 | Sun et al. | 257/704 |
| 2006/0258392 A1 | * | 11/2006 | Arneson et al. | 455/550.1 |

\* cited by examiner

*Primary Examiner* — Neil Abrams
(74) *Attorney, Agent, or Firm* — AlbertDhand LLP

(57) ABSTRACT

An electronic component cover comprises a plate having a first region adapted to substantially cover at least one side of a first electronic component. The plate is adapted to accommodate a second electronic component thereon, such as a SIM card or a SIM card reader. The plate may include a second region to accommodate the second electronic component therein. The electronic component cover may comprise one or more leads adapted to provide electrical communication between the first electronic component and the second electronic component. The one or more leads are electrically isolated from the plate. The cover may further comprise a nonconductive mount adapted to accommodate the second electronic component thereon. The nonconductive mount secures the one or more leads to the plate while electrically isolating the one or more leads from the plate.

19 Claims, 6 Drawing Sheets

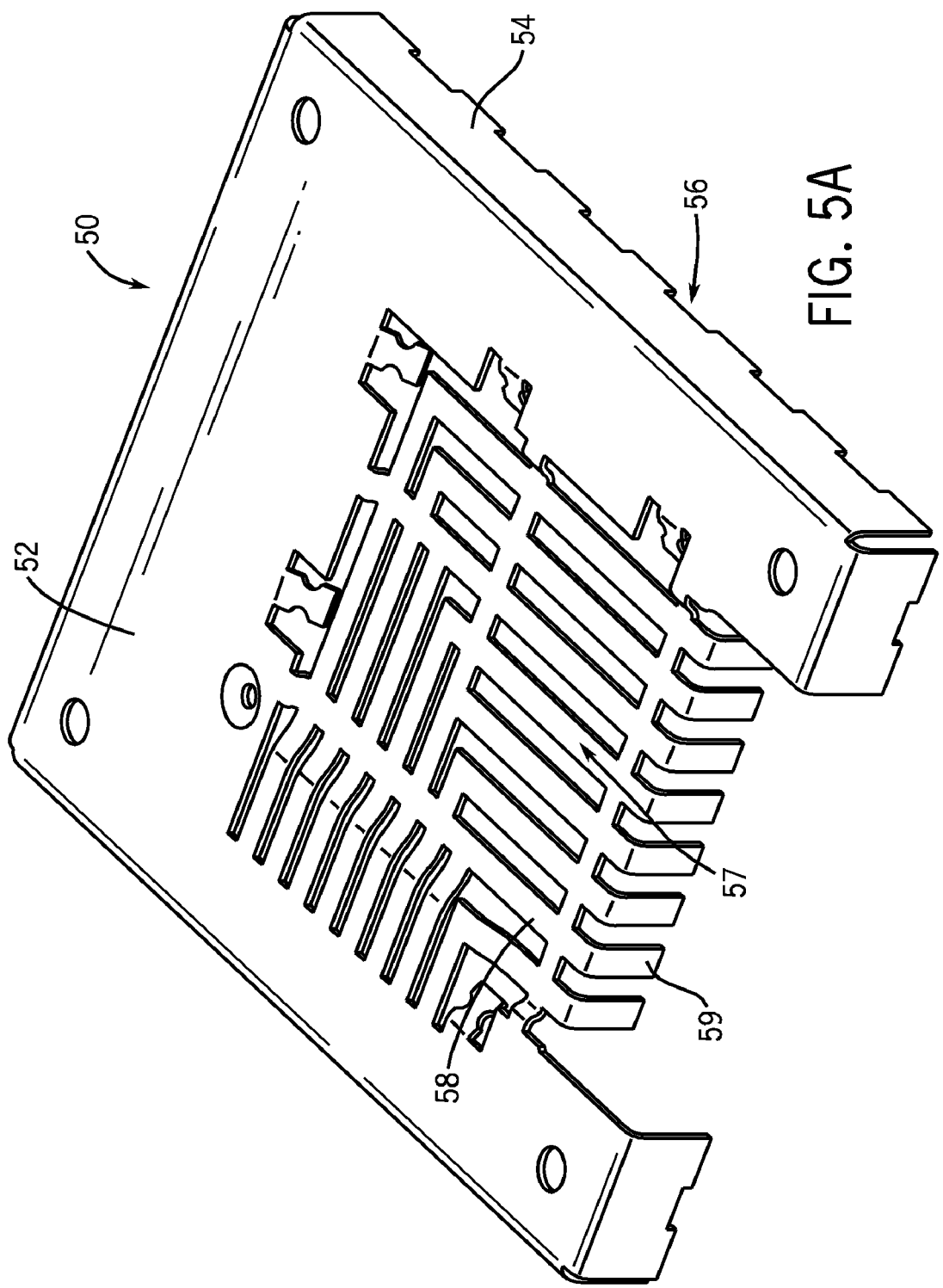

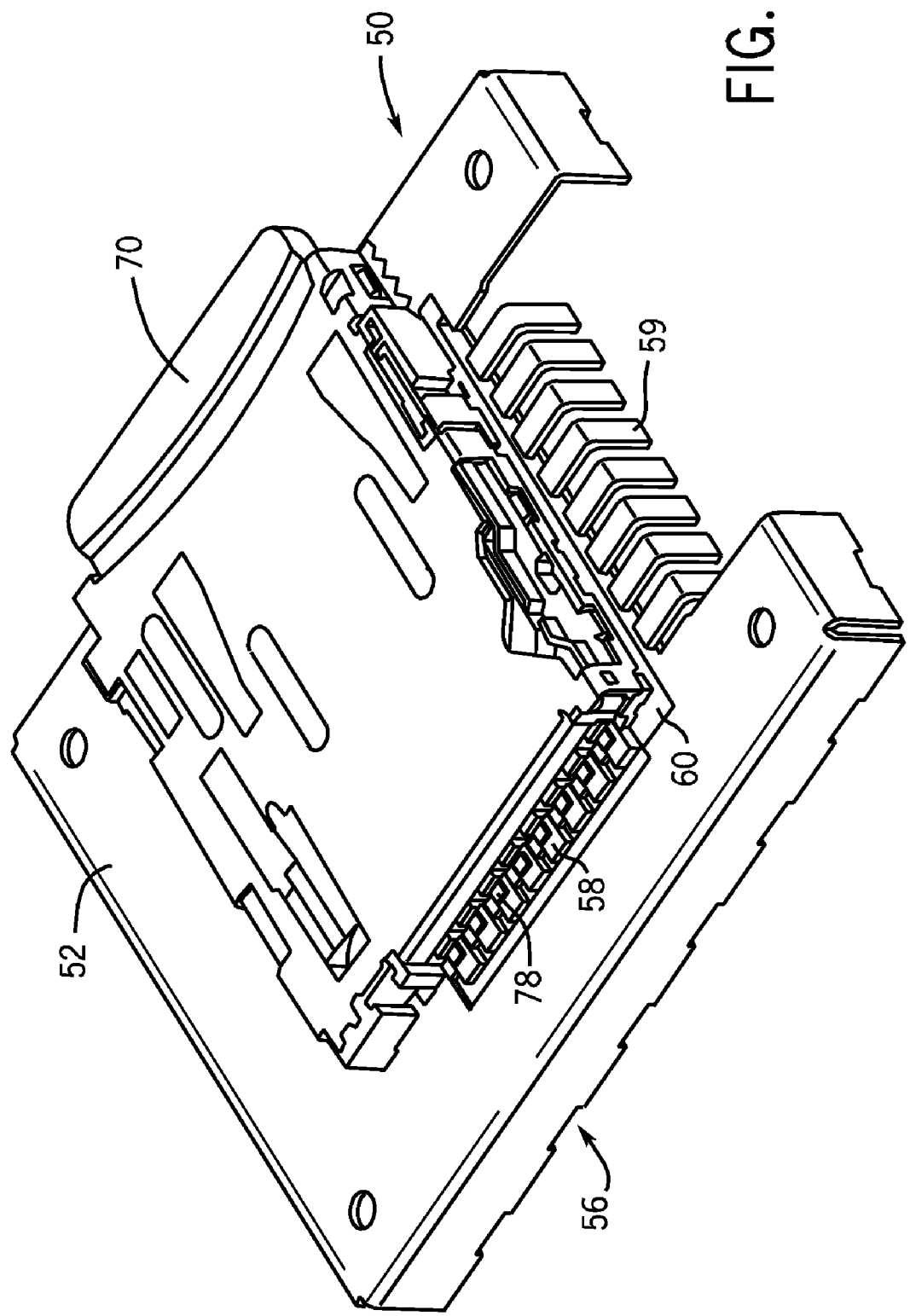

ELECTRONIC COMPONENT COVER AND ARRANGEMENT

RELATED APPLICATIONS

This application is a continuation of U.S. patent application Ser. No. 11/768,166 filed on Jun. 25, 2007, which is hereby incorporated in its entirety for all purposes.

BACKGROUND OF THE INVENTION

The present invention relates generally to the field of electronic devices and, more particularly, to arrangements for electronic component covers in such devices.

Many electronic devices, such as laptop computers, are provided with various electronic components, such as an embedded wireless modem to allow the devices to communicate with networks or other devices. Such electronic components often require coupling to other electronic components within the devices for proper operation. For example, communication via a wireless modem can often require security features which require the electronic device to identify itself or the user to the network or other device. Often, this is achieved by a subscriber identity module (SIM) card provided on the communication device. The SIM card may include identification data for one or more users and/or the device.

FIG. 1 illustrates a conventional communication device 10 having an embedded wireless modem 12 and a SIM card 14. Due to lack of space near the modem 12, the SIM card 14 is typically positioned remotely from the modem 12 in the device 10. This remote location of the SIM card 14 has the disadvantage of requiring an electrical connection 16 to enable interfacing of the modem 12 and the SIM card 14.

SUMMARY OF THE INVENTION

One aspect of the invention relates to an electronic component cover comprising a plate having a first region adapted to substantially cover at least one side of a first electronic component. The plate is adapted to accommodate a second electronic component thereon.

In one embodiment, the first electronic component is a modem and the second electronic component is a memory card or a memory card reader.

In one embodiment, the plate forms a shield.

In one embodiment, the plate includes a second region to accommodate the second electronic component therein. The second region may include tabs to secure the second electronic component therein. The tabs may be adapted to removably secure the second electronic component in the second region.

In another embodiment, the second region is adapted to accommodate the second electronic component on an inside of the plate.

The first region and the second region may be adapted to allow an electrical coupling of the first electronic component and the second electronic component.

In one embodiment, the modem shield further comprises one or more tabs adapted to secure the plate to a board on which the first electronic component is adapted to be mounted.

The plate may be formed of tin-plated steel.

In one embodiment, the electronic component cover further comprises one or more leads adapted to provide electrical communication between the first electronic component and the second electronic component. The one or more leads are electrically isolated from the plate. In one embodiment, the plate is formed of a polymer material and the one or more leads are etched onto the polymer material. In a particular embodiment, the electronic component cover further comprises a nonconductive mount adapted to accommodate the second electronic component thereon. The nonconductive mount secures the one or more leads to the plate while electrically isolating the one or more leads from the plate. The nonconductive mount may be formed of a plastic.

In another aspect of the invention, an electronic component arrangement comprises a first electronic component adapted to be mounted on a circuit board and a cover having a first region substantially covering at least one side of the first electronic component, the cover being adapted to accommodate a second electronic component thereon.

In another aspect, the invention includes an electronic component arrangement comprising a first electronic component adapted to be mounted on a circuit board, a cover and a second electronic component. The cover has a first region substantially covering at least one side of the first electronic component. The second electronic component is positioned upon the cover.

In another aspect of the invention, a communication device comprises an electronic component arrangement. The electronic component arrangement comprises a first electronic component adapted to be mounted on a circuit board, a cover and a second electronic component. The cover has a first region substantially covering at least one side of the first electronic component. The second electronic component is positioned upon the cover.

In one embodiment, the second electronic component is a SIM card.

BRIEF DESCRIPTION OF THE DRAWINGS

FIGS. 5A-5D illustrate the formation of an electronic component cover arrangement according to an embodiment of the present invention.

DETAILED DESCRIPTION OF CERTAIN EMBODIMENTS

Embodiments of the present invention take advantage of space often wasted in the region of a first electronic component, such as an embedded modem. Such wasted space can be adapted to accommodate a second electronic component, such as a SIM card or a SIM card reader.

Figure 1:
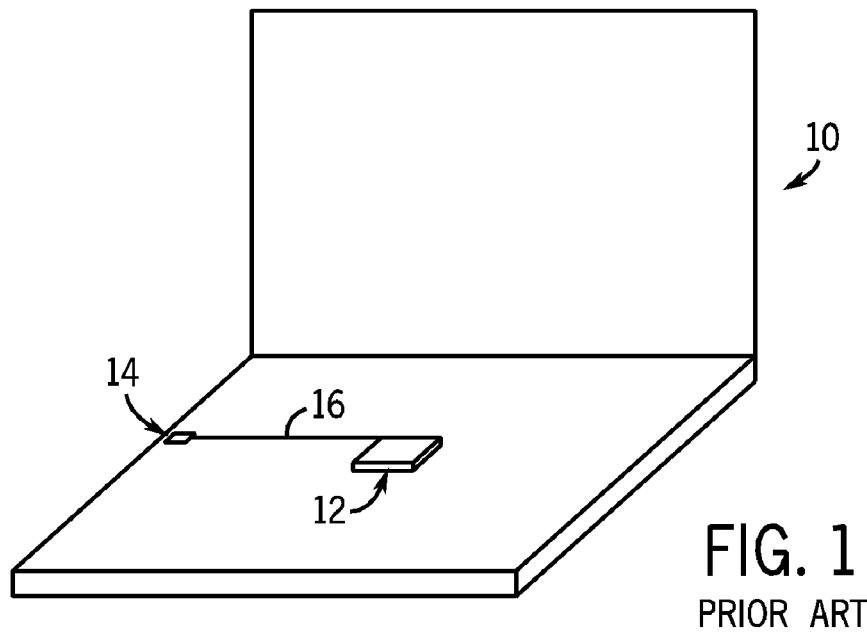
FIG. 1 illustrates an exemplary prior art electronic component arrangement in a device.
Figure 2:
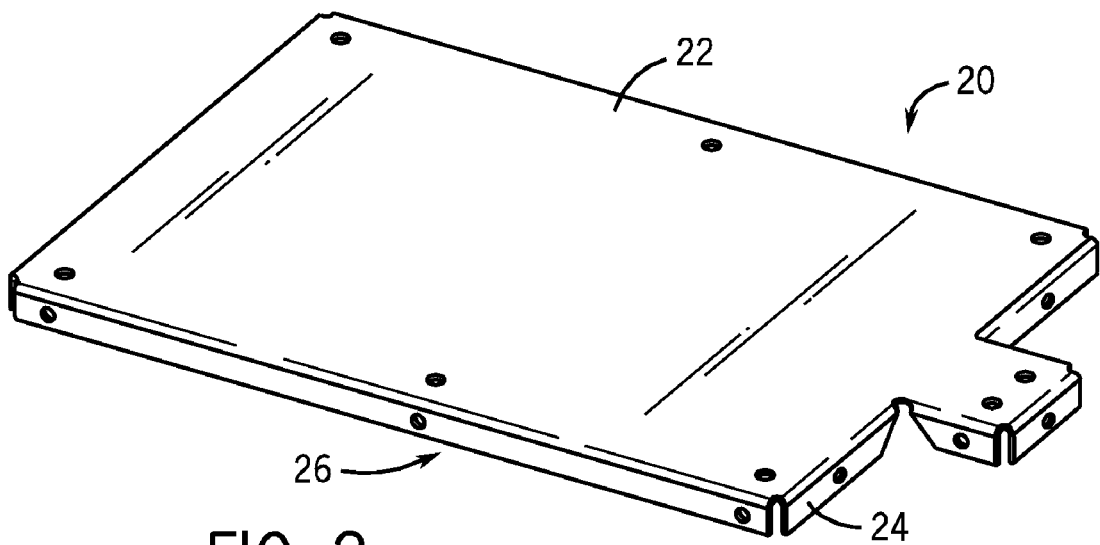
FIG. 2 illustrates an exemplary cover for an electronic component.

FIG. 2 illustrates an electronic component cover 20, such as a modem shield found around many embedded modems to provide protection for the modems. The electronic component cover 20 is adapted to substantially surround a first electronic component, such as a modem, installed on a communication device. In this regard, the electronic component cover 20 includes a top surface 22 which covers the first electronic component and side legs 24 which can secure the electronic component cover 20 to a board on which the first electronic component is mounted. Thus, the electronic component cover 20 is secured to the board while substantially surrounding the first electronic component, which can be accommodated in a region 26 formed by the top surface 22 and the side legs 24.

As illustrated in FIG. 2, the top surface 22 of the electronic component cover 20 is a flat surface. However, electronic components are often not flat. Thus, empty space typically exists between the electronic component cover 20 and the first electronic component. In accordance with embodiments of the invention described below, this empty space can be utilized to form an electronic component cover adapted to accommodate a second electronic component. For example, in one embodiment, the electronic component cover 20 is a shield for a wireless modem, and the empty space can be adapted to accommodate a SIM card, a SIM card reader or both.

Figure 3:
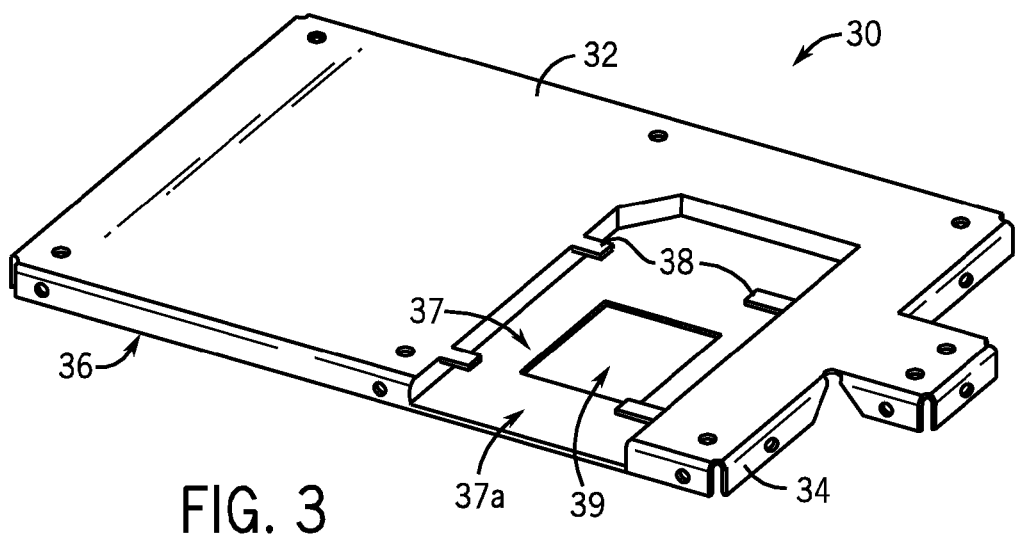
FIG. 3 illustrates an embodiment of an electronic component cover according to an embodiment of the present invention.

FIG. 3 illustrates an electronic component cover in accordance with an embodiment of the present invention. The electronic component cover 30 is in the form of a plate formed of a variety of materials. In a particular embodiment, the electronic component cover is formed generally of tin-plated steel.

The electronic component cover includes a top surface 32 and side legs 34 forming a first region 36 (under the top surface 32) to accommodate a first electronic component (not shown), such as an embedded modem.

The embodiment of the electronic component cover illustrated in FIG. 3 includes a second region 37 formed on the outside of the electronic component cover 30. The second region 37 is sized and shaped to accommodate a second electronic component, such as a SIM card (not shown), therein. The first electronic component housed is the first region 36 and the second electronic component housed in the second region 37 may include any number of electronic components. As noted above, in one embodiment, a wireless modem may be housed in the first region 36, and a SIM card reader may be accommodated in the second region. The SIM card and the modem may be of any type, such as in accordance with certain standards, for example. In embodiments of the present invention, the first and second electronic components may include (1) active circuitry, such as SIM cards, memory cards, other integrated circuits and modems, (2) passive circuitry such as filters, resistors, capacitors and inductors, (3) antennas, (4) electrical or mechanical devices such as switches, LED's, displays, heat sinks, speakers and fans, and (5) power sources such as batteries. In one embodiment, the first or second electronic component may include active circuitry forming a Bluetooth-capable card adapted to receive or transmit Bluetooth signals.

The electronic component cover 30 may be adapted to be snapped onto a printed circuit board. For example, the side legs 34 (or tabs thereon) of the electronic component cover 30 may snap into slots formed on the printed circuit board such that the electronic component cover 30 covers the first electronic component mounted on the printed circuit board. Thus, the electronic component cover 30 may be removably attached to a printed circuit board. Alternatively, the electronic component cover 30 may be irremovably fastened to the printed circuit board, such as by soldering.

A second electronic component, such as a SIM card or SIM card reader, may be positioned on the electronic component cover 30 within the second region 37 by sliding through an entry 37a of the second region 37. Tabs 38 are provided on the edges of the second region 37 to secure the second electronic component within the second region 37. In one embodiment, the tabs 38 may be adapted to removably secure the second electronic component in the second region. Thus, when desired by a user, the second electronic component may be removed by sliding it through the entry 37a.

The electronic component cover 30 is provided with an opening 39 to allow electrical coupling or communication between the second electronic component in the second region 37 and the first electronic component in the first region 36. In this regard, electrical contacts may be provided on the first electronic component such that they are accessible through the opening 39. Corresponding contacts may be provided on the second electronic component such that electrical communication between the first and second electronic components is made available when the second electronic component is positioned in the second region.

In the embodiment illustrated in FIG. 3, while the first electronic component is inside the electronic component cover 30, the second electronic component is positioned in the second region 37 on the outside of the electronic component cover. In another embodiment, the second region 37 may be formed such that the second electronic component is also positioned on an inside of the electronic component cover 30. One such embodiment is illustrated in FIG. 4.

Figure 4:
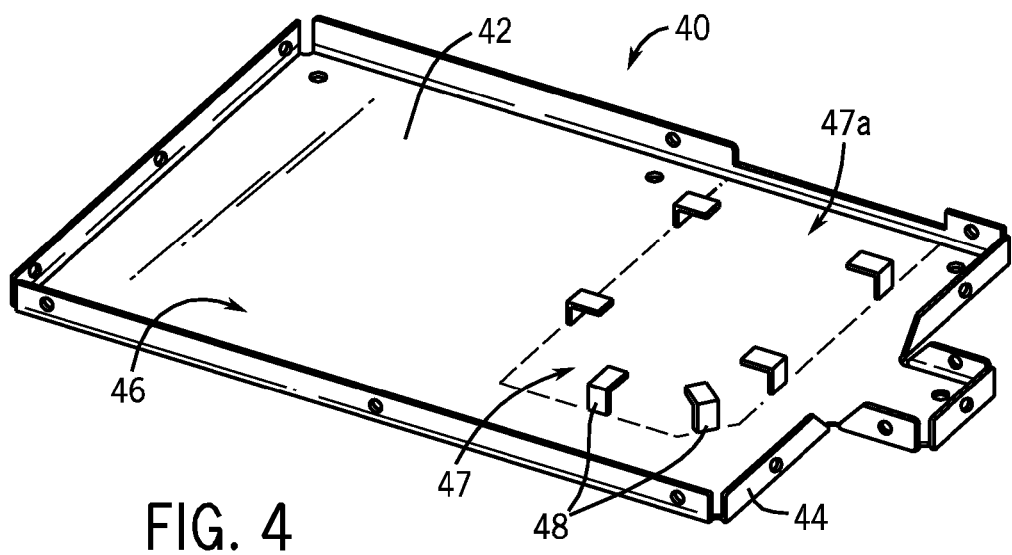
FIG. 4 illustrates another embodiment of an electronic component cover according to an embodiment of the present invention.

The electronic component cover 40 illustrated in FIG. 4 is similar to that illustrated in FIG. 3 and includes a top surface 42 and side legs 44 forming a first region 46. In the embodiment illustrated in FIG. 4, a second region 47 is formed such that the second electronic component may be accommodated on the inside of the electronic component cover 40. Thus, the top surface 42 of the electronic component cover 40 may be a flat surface with tabs 48 extending underneath the top surface 42 of the electronic component cover 40. The second electronic component may be positioned in the second region 47 by sliding the second electronic component through an entry 47a of the second region 47.

As noted above, in some embodiments, the electronic component cover may be adapted to allow electrical communication between the first and second electronic components. While some embodiments may include an opening to allow such electrical communication, other embodiments, as illustrated in FIGS. 5A-5D, may provide leads to enable such communication.

Figure 5B:
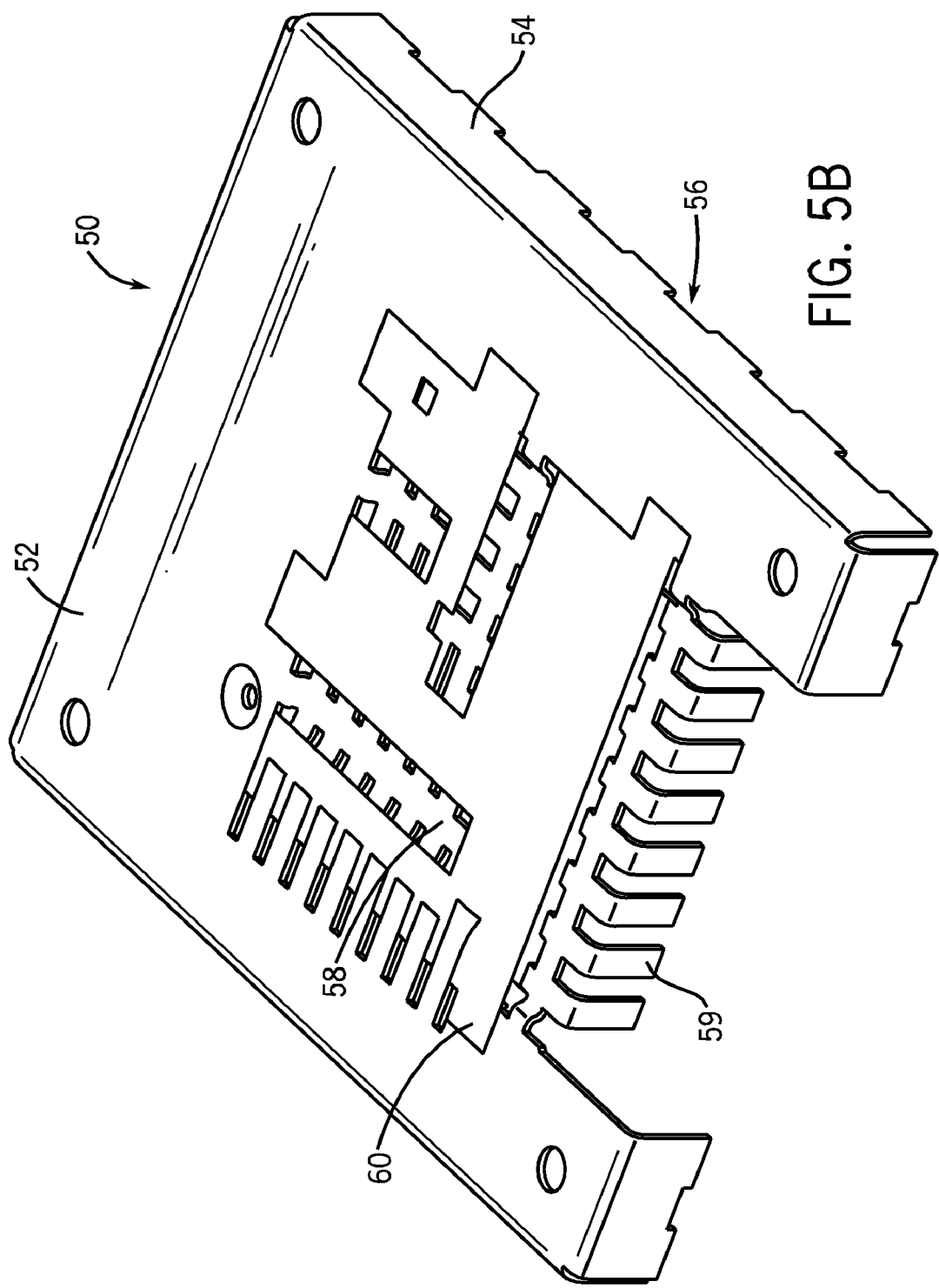

FIGS. 5A-5D illustrate the process of forming an electronic component cover and arrangement in accordance with embodiments of the present invention. Referring first to FIG. 5A, a template for an electronic component cover may be formed by any of various known methods, such as by stamping a metal sheet into the desired form. The electronic component cover 50 includes a top surface 52 and side legs 54 forming a first region 56 adapted to accommodate a first electronic component, such as an embedded modem. A second region 57 is provided on the top surface to accommodate a second electronic component, such as a SIM card reader. The top surface 52 is provided with cut-outs for leads 58, as well as lead ends 59 extending downward toward the first electronic component or the printed circuit board.

Referring now to FIG. 5B, the electronic component cover 50 of FIG. 5A is illustrated with a nonconductive mount 60 formed in at least the second region 57. The nonconductive mount 60 may be formed of a plastic and may be formed by, for example, molding the plastic around the leads 58. In one embodiment, this is achieved by an "insert molding" process in which the stamped metal is positioned within a molding tool, and the plastic is formed around the stamped metal by injection molding. In this regard, the nonconductive mount 60 is formed to cover selected regions of the leads 58 while desired portions of the leads 58 are left exposed.

In one embodiment, the nonconductive mount 60 is formed of a high-temperature plastic, such Amodel® available from the Solvay Advanced Polymers. Use of a high-temperature plastic allows the electronic component cover 50 to go through the high temperatures of a surface mount line. This, in turn, allows soldering in line of the electronic component cover 50 to, for example, a printed circuit board.

Figure 5C:
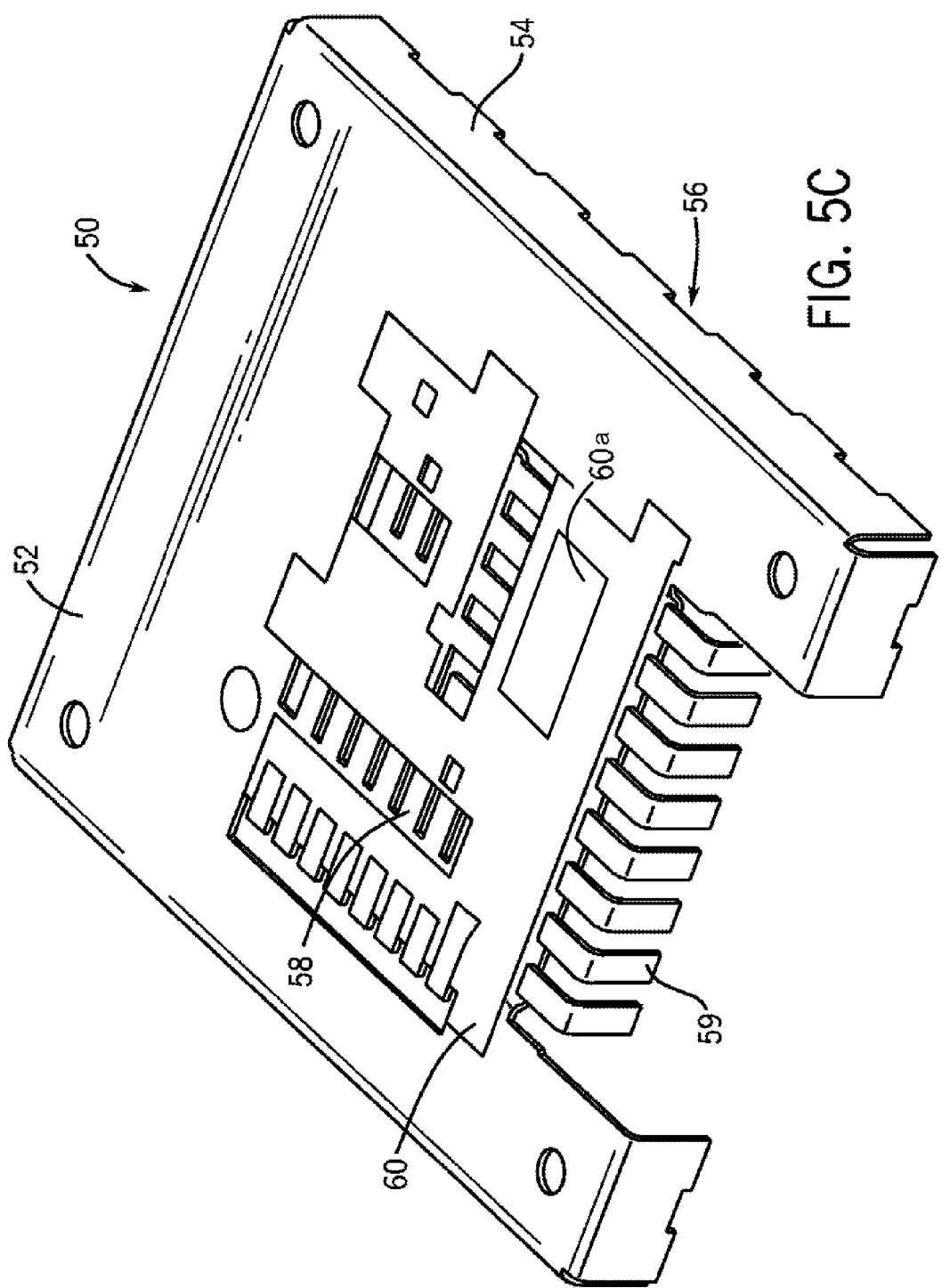

Referring now to FIG. 5C, the leads 58 are cut such that the leads 58 and the lead ends 59 are electrically isolated from the top surface 52 of the electronic component cover 50. The leads 58 may be cut using any of a number of known methods. In one embodiment, a laser-cut method using a CO2 laser is employed to achieve the desired result. In another embodiment, the stamped electronic component cover 50 shown in FIG. 5A may be provided with thinned-out portions corresponding to the locations to be cut. Thus, a stamping die may be used to break the leads 58 at the thinned-out locations.

Referring now to FIG. 5D, an arrangement is illustrated with a SIM card reader 70 (with a SIM card 70a positioned therein) positioned on the electronic component cover 50. The SIM card 70 is positioned on the nonconductive mount 60. The SIM card reader 70 may be secured to the nonconductive mount 60 and the electronic component cover 50 by way of soldering.

With the SIM card reader 70 properly positioned, connectors of the SIM card reader 70 become in contact with the leads 58, which allow electrical communication with the first electronic component (e.g., a modem) in the first region 56 or the printed circuit board 71 through the lead ends 59. The assembly including the printed circuit board 71, the modem and the SIM card reader 70 may be connected to a communication device by way of, for example, a universal serial bus (USB) connector.

In another embodiment, the electronic component cover 60 is formed of a polymer material, and the leads 58, 59 are formed by etching metal plating onto the polymer material. In such a configuration, the nonconductive mount 60 may not be required.

In another embodiment, the second component is an antenna 60a embedded in the nonconductive mount 60. In this regard, the antenna 60a may be held in a desired position during an "insert molding" process. Thus, the antenna 60a is positioned within the insulated nonconductive mount 60.

Thus, with embodiments of the present invention, the SIM card 70 or any other second electronic component can be positioned directly and proximate to the first electronic component (such as a modem).

While particular embodiments of the present invention have been disclosed, it is to be understood that various different modifications and combinations are possible and are contemplated within the true spirit and scope of the appended claims. There is no intention, therefore, of limitations to the exact abstract and disclosure herein presented.

What is claimed is:

1. An electronic component cover, comprising:
  a plate having a first region adapted to substantially cover at least one side of a first electronic component;
  the plate having a second region comprising a cavity in a surface of the plate adapted to accommodate a second electronic component such that, when positioned in the cavity, an outer surface of the second electronic component is substantially flush with the surface of the plate; and
  one or more leads adapted to provide electrical communication between the first electronic component and the second electronic component;
  wherein the one or more leads are electrically isolated from the plate.

2. The electronic component cover of claim 1, wherein the first electronic component is a modem and the second electronic component is a memory card or a memory card reader.

3. The electronic component cover of claim 1, wherein the first electronic component or the second electronic component includes at least one of the following: (1) active circuitry, (2) passive circuitry, (3) an antenna, (4) an electrical or mechanical device, or (5) a power source.

4. The electronic component cover of claim 1, wherein the plate forms a shield.

5. The electronic component cover of claim 1, wherein the plate is formed of tin-plated steel.

6. The electronic component cover of claim 1, wherein the plate is formed of a polymer material and the one or more leads are etched onto the polymer material.

7. The electronic component cover of claim 1, further comprising:
  a non-conductive mount adapted to accommodate the second electronic component thereon;
  wherein the nonconductive mount secures the one or more leads to the plate while electrically isolating the one or more leads from the plate.

8. The electronic component cover of claim 7, wherein the second electronic component is an antenna embedded in the nonconductive mount.

9. The electronic component cover of claim 7, wherein the conductive mount is formed of a plastic.

10. An electronic component arrangement, comprising:
  a first electronic component adapted to be mounted on a circuit board;
  a cover having a first region substantially covering at least one side of the first electronic component, the cover having a second region comprising a cavity in a surface of the cover adapted to accommodate a second electronic component such that, when positioned in the cavity, an outer surface of the second electronic component is substantially flush with the surface of the cover; and
  one or more leads adapted to provide electrical communication between the first electronic component and the second electronic component;
  wherein the one or more leads are electrically isolated from the cover.

11. The electronic component arrangement of claim 10, wherein the cover is formed of a polymer material and the one or more leads are etched onto the polymer material.

12. The electronic component arrangement of claim 10, further comprising:
  a nonconductive mount adapted to accommodate the second electronic component thereon;
  wherein the nonconductive mount secures the one or more leads to the cover while electrically isolating the one or more leads from the cover.

13. The electronic component arrangement of claim 12, wherein the second electronic component is an antenna embedded in the nonconductive mount.

14. The electronic component arrangement of claim 12, wherein the nonconductive mount is formed of a plastic.

15. An electronic component arrangement, comprising:
  a first electronic component adapted to be mounted on a circuit board;
  a cover having a first region substantially covering at least one side of the first electronic component;
  a second electronic component positioned in a cavity in a surface of the cover such that an outer surface of the second electronic component is substantially flush with the surface of the cover; and one or more leads adapted to provide electrical communication between the first electronic component and the second electronic component;

wherein the one or more leads are electrically isolated from the cover.

16. The electronic component arrangement of claim 15, wherein the cover is formed of a polymer material and the one or more leads are etched onto the polymer material.

17. The electronic component arrangement of claim 15, further comprising:

a nonconductive mount accommodating the second electronic component thereon;

wherein the nonconductive mount secures the one or more leads to the cover while electrically isolating the one or more leads from the cover.

18. The electronic component arrangement of claim 17, wherein the second electronic component is an antenna embedded in the nonconductive mount.

19. The electronic component arrangement of claim 17, wherein the nonconductive mount is formed of a plastic.

* * * * *